United States Patent
Tynell et al.

(10) Patent No.: US 12,252,790 B2
(45) Date of Patent: Mar. 18, 2025

(54) GAPFILL METHODS AND PROCESSING ASSEMBLIES

(71) Applicant: ASM IP Holding B.V., Almere (NL)

(72) Inventors: Tommi Tynell, Espoo (FI); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/367,480

(22) Filed: Sep. 13, 2023

(65) Prior Publication Data

US 2024/0117494 A1    Apr. 11, 2024

Related U.S. Application Data

(60) Provisional application No. 63/407,191, filed on Sep. 16, 2022.

(51) Int. Cl.
| | | |
|---|---|---|
| *C23C 16/50* | (2006.01) | |
| *C23C 16/455* | (2006.01) | |
| *C23C 16/513* | (2006.01) | |
| *C23C 16/515* | (2006.01) | |

(52) U.S. Cl.
CPC ...... *C23C 16/513* (2013.01); *C23C 16/45519* (2013.01); *C23C 16/515* (2013.01)

(58) Field of Classification Search
CPC .......................................... C23C 16/00–16/56
See application file for complete search history.

(56) References Cited

U.S. PATENT DOCUMENTS

| | | | | |
|---|---|---|---|---|
| 7,482,247 | B1 * | 1/2009 | Papasouliotis | C23C 16/44 |
| | | | | 257/E21.546 |
| 7,524,735 | B1 * | 4/2009 | Gauri | C23C 16/56 |
| | | | | 438/436 |
| 9,412,581 | B2 * | 8/2016 | Thadani | H01L 21/02126 |
| 10,755,922 | B2 * | 8/2020 | Blanquart | H01L 21/76224 |
| 2007/0281495 | A1 * | 12/2007 | Mallick | C23C 16/452 |
| | | | | 257/E21.252 |
| 2015/0118862 | A1 * | 4/2015 | Reilly | H01L 21/76837 |
| | | | | 438/778 |
| 2015/0364603 | A1 * | 12/2015 | Cheng | H01L 29/42392 |
| | | | | 257/192 |
| 2016/0020089 | A1 | 1/2016 | Thadani et al. | |
| 2017/0148628 | A1 * | 5/2017 | Swaminathan | C23C 16/45523 |
| 2018/0061636 | A1 * | 3/2018 | Li | C01B 33/126 |
| 2018/0294154 | A1 * | 10/2018 | Manna | H01L 21/02488 |
| 2019/0157433 | A1 * | 5/2019 | Hashemi | H01L 29/737 |
| 2020/0161123 | A1 * | 5/2020 | Kao | H01L 21/0214 |
| 2021/0193508 | A1 * | 6/2021 | Mun | H10B 12/056 |

* cited by examiner

*Primary Examiner* — Cachet I Proctor
(74) *Attorney, Agent, or Firm* — Laine IP Oy; Mark W. Scott

(57) ABSTRACT

The disclosure relates to methods of filling gaps in semiconductor substrates. A method of filling a gap is disclosed. The method including providing a substrate having a gap in a reaction chamber, providing a first precursor including silicon and carbon into the reaction chamber in a vapor phase, wherein the first precursor includes at least one unsaturated carbon-carbon bond and at least one atom selected from oxygen and nitrogen. The method further includes providing a first plasma into the reaction chamber to polymerize the first precursor for forming a gap filling material, thereby at least partially filling the gap with the gap filling material. In some embodiments, the at least one unsaturated bond is a double bond.

18 Claims, 3 Drawing Sheets

$t$

GAPFILL METHODS AND PROCESSING ASSEMBLIES

CROSS-REFERENCE TO RELATED APPLICATIONS

This application claims priority to and the benefit of U.S. Provisional Application No. 63/407,191, filed Sep. 16, 2022, which is incorporated by reference herein in its entirety.

FIELD OF INVENTION

The present disclosure generally relates to the field of semiconductor processing methods and systems, and to the field integrated circuit manufacture. In particular, methods and systems suitable for filling a gap are disclosed.

BACKGROUND OF THE DISCLOSURE

Dielectric gapfill processes need to be constantly improved as new device architectures place ever more stringent requirements on thermal budgets as well as gap aspect ratios, spacing, and shapes. Conformal processes with good step coverage and low-viscosity dielectric materials have offered solutions for gapfill problems in the past, but the ideal gapfill process would produce film growth from the bottom of the trench upwards, filling the gap without the need for subsequent planarization steps. Further, high carbon content in gapfill materials is sought after, as generally, etch resistance increases with increasing carbon content of the dielectric material.

Thus, methods are sought in the art to fill gaps with materials having a high carbon content.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Various embodiments of the present disclosure relate to methods of filling a gap, to structures formed by said methods, and to deposition assemblies for performing said methods.

In one aspect, a method of filling a gap is disclosed. The method comprises providing a substrate comprising a gap in a reaction chamber, providing a first precursor comprising silicon and carbon into the reaction chamber in a vapor phase, wherein the first precursor comprises at least one unsaturated carbon-carbon bond and at least one atom selected from oxygen and nitrogen. The method further comprises providing a first plasma into the reaction chamber to polymerize the first precursor for forming a gap filling material, thereby at least partially filling the gap with the gap filling material. In some embodiments, the at least one unsaturated bond is a double bond.

In some embodiments, the first plasma is generated from an inert gas. In some embodiments, the inert gas is selected from a group consisting of $N_2$, He, Ne and Ar.

In some embodiments, the first precursor comprises an alkyl silane. In some embodiments, the alkyl silane comprises at least two different alkyl groups.

In some embodiments, the first precursor comprises an alkoxy silane. In some embodiments, the first precursor comprises a vinyl group.

In some embodiments, the first precursor does not comprise nitrogen. In some embodiments, the first precursor does not comprise oxygen. In some embodiments, the first precursor does not comprise a halogen.

In some embodiments, the first precursor consists of Si, C, O and H. In some embodiments, In some embodiments, the first precursor consists of Si, C, N and H In some embodiments, the first precursor is selected from a group consisting of vinyltrimethoxysilane, vinyltriethoxysilane, vinyldimethoxysilane, vinyldiethoxysilane, vinylmethyldimethoxysilane, vinylmethyldiethoxysilane, vinylethyldimethoxysilane, vinylethyldiethoxysilane, vinylmethoxysilane, vinylethoxysilane, vinyldimethylmethoxysilane, vinyldimethylethoxysilane, vinyldiethylmethoxysilane, vinyldiethylethoxysilane, diethenyldimethoxysilane, diethenyldiethoxysilane, diethenylmethoxysilane, diethenylethoxysilane, diethenylmethylmethoxysilane, diethenylmethylethoxysilane, diethenylethylmethoxysilane and diethenylethylethoxysilane.

In some embodiments, the gap filling material is a fluid at the time of filling the gap.

In some embodiments, the first plasma is provided into the reaction chamber in pulses.

In some embodiments, the carbon content of the gap filling material is at least 30 at-%.

In some embodiments, a second precursor is provided into the reaction chamber in a vapor phase.

In some embodiments, a second plasma is provided into the reaction chamber after providing the first plasma into the reaction chamber to amend the properties of the gap filling material. In some embodiments, the second plasma is generated from a gas comprising hydrogen.

In some embodiments, the gap filling material has a wet etch rate ratio of below 0.6.

In another aspect, a method of filling a gap is disclosed. The method comprises providing a substrate comprising a gap in a reaction chamber, providing a first precursor into the reaction chamber in a vapor phase and providing a first plasma into the reaction chamber to form a fluid gap filling material, thereby at least partially filling the gap with the gap filling material. In the method, the first precursor comprises a molecule according to formula (I) or (II),

(I)

(II)

wherein each of R1, R2, R3 and R4 is independently selected from H, C1 to C6 saturated and unsaturated alkyl groups, with the proviso that at least one of R1, R2, R3 and R4 comprises independently a silicon atom and an atom selected from nitrogen and oxygen.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments. The headings provided herein, if any, are for convenience only and do not necessarily affect the scope or meaning of the claimed invention.

BRIEF DESCRIPTION OF THE DRAWING FIGURES

The accompanying drawings, which are included to provide a further understanding of the disclosure and constitute a part of this specification, illustrate exemplary embodiments, and together with the description help to explain the principles of the disclosure.

Figure 1:
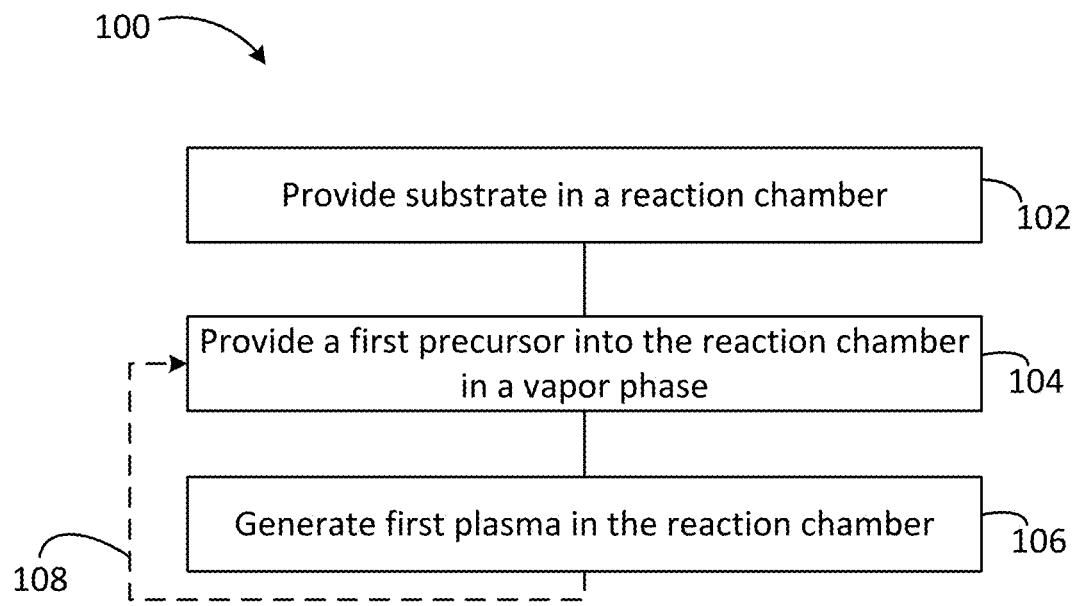
FIG. 1 illustrates a method in accordance with exemplary embodiments of the current disclosure.

The illustrations presented herein are not meant to be actual views of any particular material, structure, or device, but are merely idealized representations that are used to describe embodiments of the disclosure. It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the current disclosure. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Gapfill behavior of deposited material may be improved by using precursors that can be induced to polymerize in the gas phase by means of an energetic plasma strike, for example. Without limiting the current disclosure to any specific theory, forming polymer species that behave like liquids on the deposition surface and fill up gaps through the effects of gravity and capillary forces. By polymers is herein meant chains of any length formed by a precursor or a part thereof. Also chains that may be referred to oligomers, such as dimers, trimers, tetramers, pentamers, hexamers, heptamers etc. are considered polymers for the purposes of the current disclosure. The polymers according to the current disclosure may be linear or branched. The methods according to the current disclosure may lead to a polymer composition of variable lengths and branching pattern.

Suitable polymerization necessary for good gapfill behavior may be brought about by using precursors that contain proper functional groups or sufficiently long backbones so that the interconnects necessary for polymerization have a suitable chance of forming. The deposited gapfill material thus comprises organic polymer material, but the composition and material properties can be adjusted through proper selection of precursors and post-treatment processes.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas.

The term deposition process as used herein can refer to the introduction of one or more precursors (and/or reactants) into a reaction chamber to deposit a material on a substrate, including a gap in the substrate. Cyclical deposition processes are examples of deposition processes.

As used herein, the term gap filling material may refer to a composition of matter that is liquid, or that can form a liquid, under the conditions under which is formed and which has the capability to form a solid film. A gap filling material can be in a flowable state permanently, or at least temporarily, i.e. for a pre-determined amount of time before the gap filling material solidifies. For example, a polymerizable precursor may start undergoing polymerization in a gaseous state, and it may form oligomeric species. The oligomeric species can condense to form a flowable phase while still continuing to undergo polymerization.

In some embodiments, a method as described herein can comprise forming a material such as a gap filling material by means of a cyclic deposition process. The term "cyclic deposition process" or "cyclical deposition process" can refer to a sequential introduction of precursors (and/or reactants) into a reaction chamber to deposit a layer over a substrate. A cyclical deposition process can include cyclically providing a precursor, and providing a plasma into a reaction chamber. Additionally or alternatively, a cyclical deposition process can include cyclically exposing a substrate to active species provided into a remote plasma.

As used herein, the term purge may refer to a procedure in which at least one of flow of a precursor, flow of a reactant, and exposure of a substrate to active species, is temporarily stopped. Suitably, active species can be generated by means of a plasma. A purge can occur between two pulses. A pulse can comprise executing a process step, such as providing a precursor into a reaction chamber or providing plasma into the reaction chamber, for a pre-determined amount of time. The duration of executing the process step in question may be called pulse time. A purge then comprises temporarily stopping exposure of the substrate to one or more of precursor, reactant, and plasma. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form:

moving a substrate from a first location to which a first precursor is continually supplied, through a purge gas curtain, to a second location to which a second precursor is continually supplied. In some embodiments, purge may comprise flowing an inert gas into the reaction chamber.

As used herein, the term precursor includes a gas or a material that can become gaseous and that can be represented by a chemical formula that includes an element that may be incorporated during a deposition process as described herein. In some cases, the term precursor can refer to a compound that participates in the chemical reaction that produces another compound, and particularly to a compound that constitutes a film matrix or a main skeleton of a film; the term reactant can be used interchangeably with the term precursor.

In one aspect, a method of filling a gap is disclosed herein. The method comprises providing a substrate comprising a gap in a reaction chamber, providing a first precursor comprising silicon and carbon into the reaction chamber in a vapor phase, wherein the first precursor comprises at least one unsaturated carbon-carbon bond and at least one atom selected from oxygen and nitrogen.

In the methods according to the current disclosure, a first precursor is used that comprises at least one unsaturated carbon-carbon bond. By using such a precursor, a suitably low plasma power may be selected to induce polymerization of the first precursor through the unsaturated bonds. Without limiting the current disclosure to any specific theory, the preferred utilization of the unsaturated carbon-carbon bonds in the polymerization may reduce the breakage and concomitant vaporization of small carbon-containing moieties of the first precursor molecule. This may help increase the carbon content of the deposited material over prior art CVD deposition methods, and increase the wet etch resistance of the gap filling material.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a reaction chamber where a deposition process occurs. In some processes, the continuous substrate may move through the reaction chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

In some embodiments, a substrate is a semiconductor substrate comprising a gap. Exemplary embodiments of the disclosure can be used to fill gaps, such as trenches, vias, and/or areas between fins on a surface of a substrate. Controlling carbon content of low k material is important in many applications, such as in interlayer dielectrics, and when using the low k material as insulation between metal interconnects.

The method comprises providing a substrate comprising a gap in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber is a deposition station of a multi-station chamber. In some embodiments, the reaction chamber may be single wafer reactor. In some embodiments, the reaction chamber may be a high-volume manufacturing single wafer reactor. In some embodiments, the reaction chamber may be a batch reactor for manufacturing multiple substrates simultaneously.

A gap in the current disclosure is in or on a substrate. It is intended to mean changes in the surface topology of the substrate leading to some areas of the substrate surface being lower than other areas. Gaps thus include topologies in which parts of the substrate surface are lower relative to the majority of the substrate surface. These include trenches, vias, recesses, valleys, crevices and the like. Further, also areas between elevated features protruding upwards of the majority of the substrate surface form gaps. Thus, the space between adjacent fins is considered a gap.

The gap may have tapered or slanting walls, narrowing the diameter of the gap either towards the top or towards the bottom of the gap. In some embodiments, the width of the gap may be from about 3 nm to about 400 nm. For example, the width of the gap may be from about 4 nm to about 300 nm, from about 5 nm to about 100 nm, from about 10 nm to about 50 nm, or about 20 nm. In some embodiments, the width of the gap may be from about 100 nm to about 400 nm, such as about 150 nm, 200 nm, 250 nm, 300 nm or 350 nm. In other embodiments, the width of the gap may be from about 3 nm to about 50 nm, such as from about 3 nm to 10 nm, from about 3 nm to 20 nm, from about 3 nm to about 30 nm, from about 3 nm to about 40 nm. As an example, the width of the gap may be about 4 nm, about 5 nm, about 6 nm, about 8 nm or about 12 nm, about 15 nm, about 18 nm, about 25 nm or about 35 nm.

In some embodiments, the depth of the gap is from about 10 nm to about 7 μm, or about 10 μm. For example, the depth of the gap may be from about 10 nm to about 100 nm, from about 10 nm to about 50 nm, from about 10 nm to about 500 nm, from about 10 nm to about 4 μm, from about 20 nm to about 2 μm, from about 50 nm to about 1 μm or from about 50 nm to about 500 nm. In additional examples, the depth of gap may be from about 10 nm to about 200 nm, from about 10 nm to about 100 nm, or from about 100 nm to about 7 μm, from about 200 nm to about 5 μm, from about 200 nm to about 3 μm, from about 200 nm to about 1 μm, or from about 100 nm to about 500 nm.

In some embodiments, the width to depth aspect ratio of the gap is between approximately 1:0.5 to 1:250. In certain embodiments, the width to depth aspect ratio of the gap is between approximately 1:1 to 1:200, between approximately 1:1 to 1:100, between approximately 1:0.5 to 1:50, such as 1:2, 1:3, 1:5, 1:8, 1:10, 1:20, 1:50, or 1:150.

In the methods according to the current disclosure, a first precursor comprising silicon (Si) and carbon (C) is provided into the reaction chamber with the substrate. The first precursor is provided in a vapor phase, although it may be in liquid or solid form prior to being provided into the reaction chamber. Various means, such as low pressure and increased temperature may be used to vaporize a suitable first precursor.

The first precursor according to the current disclosure comprises at least one unsaturated carbon-carbon bond and at least one atom selected from oxygen and nitrogen in addition to C and Si. In some embodiments, the first precursor consists of Si, C, O and H. In some embodiments, the first precursor consists of Si, C, N and H. In some embodiments, the first precursor comprises one C—C double bond. In some embodiments, the first precursor comprises a vinyl group, such as one, two or three vinyl groups. Thus, the first precursor according to the current disclosure may be represented by formula (III),

(III)

wherein R1 comprises a substituted silane, the substituted silane comprising at least one oxygen atom or at least one nitrogen atom. In some embodiments, R1 is Si(OCH$_3$)(CH$_3$)$_2$. In some embodiments, R1 is —Si(OCH$_3$)$_2$CH$_3$. In some embodiments, R1 is Si(OCH$_3$)$_3$.

In some embodiments, the at least one unsaturated bond is a double bond. In some embodiments, all the unsaturated bonds in the precursor are double bonds. In some embodiments, the first precursor comprises one C—C double bond. In some embodiments, the first precursor comprises two C—C double bonds. In some embodiments, the first precursor comprises three C—C double bonds. In some embodiments, the first precursor comprises more than three C—C double bonds. In some embodiments, the precursor comprises at least one double bond and at least one triple bond.

In some embodiments, the at least one unsaturated bond is a triple bond. In some embodiments, all the unsaturated bonds in the precursor are triple bonds. In some embodiments, the first precursor comprises one C—C triple bond. In some embodiments, the first precursor comprises two C—C triple bonds. In some embodiments, the first precursor comprises three C—C triple bonds. In some embodiments, the first precursor comprises more than three C—C triple bonds. In some embodiments, the first precursor comprises at least one double bond, and at least one triple bond.

In some embodiments, the first precursor comprises a silane. In some embodiments, the first precursor comprises an alkyl silane. In some embodiments, the alkyl silane comprises at least two different alkyl groups. One or more of the alkyl groups may have substituents, such as nitrogen (N) or oxygen (O). For example, at least one alkyl group of the alkyl silane may be an alkoxy group, and one or more of them may be an unsubstituted alkyl.

In some embodiments, the first precursor comprises an alkoxy silane. In some embodiments, the alkoxy silane comprises one alkoxy group. In some embodiments, the alkoxy silane comprises two alkoxy groups. In some embodiments, the alkoxy silane comprises three alkoxy groups. In some embodiments, the alkyl chains of the alkoxy groups are independently selected from linear and branched C1 to C4 alkyl groups. In some embodiments, the alkyl chains of the alkoxy groups are independently selected from methyl and ethyl. For example, the alkoxy silane may comprise one methoxy group, or an ethoxy group or a propoxy group. In some embodiments, the alkoxy silane comprises two alkoxy groups, such as dimethoxy silane, diethoxy silane or a dipropoxy silane. In some embodiments, the alkoxy silane comprises three alkoxy groups, such as trimethoxy silane, triethoxy silane or a tripropoxy silane. In some embodiments, one or more of the alkyl groups comprised in the alkoxy silane are unsaturated.

In some embodiments, the first precursor does not comprise nitrogen. In such embodiments, the first precursor comprises oxygen. In some embodiments, the first precursor does not comprise oxygen. In such embodiments, the first precursor comprises nitrogen. In some embodiments, the first precursor does not comprise a halogen. Thus, in some embodiments, the first precursor is halogen-free.

In some embodiments, the first precursor is represented by formula (I).

(I)

In formula (I), each of R1, R2, R3 and R4 is independently selected from H and C1 to C6 saturated and unsaturated alkyl groups, with the proviso that at least one of R1, R2, R3 or R4 comprises independently a silicon atom and an atom selected from nitrogen and oxygen.

In some embodiments, the first precursor is represented by formula (II).

(II)

In formula (II), each of R1 and R2 is independently selected from H and C1 to C6 saturated and unsaturated alkyl groups, with the proviso that at least one of R1 or R2 comprises independently a silicon atom and an atom selected from nitrogen and oxygen.

In some embodiments, the first precursor comprises one alkoxy group. Non-limiting examples of such molecules include ethenylmethoxysilane (vinylmethoxysilane), ethenylethoxysilane (vinylethoxysilane), vinyldimethylmethoxysilane, vinyldimethylethoxysilane, vinyldiethylmethoxysilane, vinyldiethylethoxysilane, methoxy(1-methylene-2-propen-1-yl)silane, ethenylsilane, ethenylethoxysilane, ethoxy(2-methyl-1-propen-1-yl)silane, ethenylmethoxymethylsilane, diethenylmethoxysilane, diethenylethoxysilane and ethenylpropoxysilane, ethenylethoxymethylsilane, diethenylmethylmethoxysilane, diethenylmethylethoxysilane, diethenylethylmethoxysilane and diethenylethylethoxysilane.

In some embodiments, the first precursor comprises two alkoxy groups. Non-limiting examples of such molecules include vinylmethyldimethoxysilane, vinylmethyldiethoxysilane, vinylethyldimethoxysilane, vinylethyldiethoxysilane, diethenyldiethoxysilane, bis(1,1-dimethylethoxy)ethenylmethylsilane, diethenyldimethoxysilane, ethenylmethyldipropoxysilane, dimethoxybis(1-methylene-2-propen-1-yl)silane, ethenyldiethoxysilane (vinyldiethoxysilane), ethenyldimethoxypropylsilane, dimethoxymethyl(1-methylene-2-propen-1-yl)silane, butylethenyldiethoxysilane, methyl(1-methylene-2-propen-1-yl)bis(1-methylethoxy)silane, bis(1,1-dimethylethoxy)ethenylsilane, vinyldimethoxysilane, ethenylethoxymethoxysilane and ethenyldipropoxysilane.

In some embodiments, the first precursor comprises three alkoxy groups. Non-limiting examples of such molecules include vinyltrimethoxysilane, vinyltriethoxysilane, vinyltriisopropoxysilane, vinyltriisopropenoxysilane, trimethoxy(1-methylene-2-propen-1-yl)silane, triethoxy(1-methylene-2-propen-1-yl)silane, ethenylethoxydimethoxysilane, ethenyltripropoxysilaneand triethoxy-1-propen-1-ylsilane.

The unsaturated carbon-carbon bond in the first precursor may be a triple bond. In some embodiments, the first precursor comprises one alkoxy group and the unsaturated carbon-carbon bond is a triple bond. Non-limiting examples of such molecules include ethynylmethoxydimethylsilane, diethynylmethoxymethylsilane, ethynyldimethylpropoxysilane, (ethenyloxy)ethynyldimethylsilane and ethenyl(ethenyloxy)ethynylmethylsilane. In some embodiments, the first precursor comprises two or three alkoxy groups and the unsaturated carbon-carbon bond is a triple bond. Non-limiting examples of such molecules include ethynyldimethoxymethylsilane, diethoxyethynylmethylsilane, triethoxyethynylsilane and ethynyltrimethoxysilane.

In some embodiments, the first precursor comprises a hydroxyl group. For example, the first precursor may comprise ethenylsilanediol or 1-ethenylsilanetriol.

In some embodiments, the first precursor comprises nitrogen. The first precursor may comprise a carbon-carbon double bond and one, two or three nitrogen atoms. Non-limiting examples of such molecules include 1-ethenyl-N,N,1,1-tetramethylsilanamine, 1-ethenyl-N-ethyl-1,1-dimethylsilanamine, 1-ethenyl-N,N-diethyl-1,1-dimethylsilanamine, 1-ethenyl-N,N,N',N',1-pentamethylsilanediamine, 1-ethenyl-1-ethyl-N,N,N',N'-tetramethylsilanediamine, 1,1-diethenyl-N,N,N',N'-tetraethylsilanediamine, 1-ethenyl-N,N',N''-tris(1-methylpropyl)silanetriamine and 1-ethenyl-N,N',N''-trimethylsilanetriamine. Also first precursor comprising a carbon-carbon triple bond and a nitrogen atom may be envisaged. Non-limiting examples of such molecules include 1-ethynyl-1,1-dimethylsilanamine and N,N-diethyl-1-ethynyl-1,1-dimethylsilanamine.

In some embodiments, the first precursor comprises two silicon atoms. Non-limiting examples of such molecules include [1-[dimethyl(1-methylethoxy)silyl]-1-propenyl]trimethylsilane and triethyl[2-(trimethoxysilyl)ethenyl]silane.

In the methods according to the current disclosure, chemical vapor deposition (CVD) is used to deposit the gap filling material. Specifically, plasma-enhanced CVD (PECVD) is used for the deposition. CVD processes may involve gas phase reactions or surface reactions forming material on the substrate. The reactions in CVD processes are not self-limiting, allowing the fast deposition of material layers. A CVD process may comprise one or more precursors and/or reactants in forming the deposited material. The reactants can be provided simultaneously to the reaction chamber or substrate, or in partially or completely separated pulses (cyclic CVD). The substrate and/or reaction chamber can be heated to promote the reaction between the gaseous reactants. A PECVD process may comprise one or more precursors, exposed to plasma to increase the reactivity and/or chemisorption to the substrate surface. In some embodiments the precursor(s) and possible plasma are provided until a layer having a desired thickness is deposited.

The method according to the current disclosure comprises providing a first plasma into the reaction chamber to polymerize the first precursor for forming a gap filling material, thereby at least partially filling the gap with the gap filling material. The first plasma may be provided at least partially simultaneously with providing the first precursor into the reaction chamber. Providing the first reactant into the reaction chamber and providing the first plasma into the reaction chamber may be performed substantially completely simultaneously. In some embodiments, the first plasma is provided into the reaction chamber at least partially separately from providing the first precursor into the reaction chamber.

In some embodiments, the first plasma is provided into the reaction chamber by generating it in the reaction chamber. This may be termed direct plasma. In some embodiments, the first plasma is provided into the reaction chamber from an external plasma source. This type of plasma may be termed remote plasma. Without limiting the current disclosure to any specific theory, properties of direct plasma may have advantages in the embodiments of the current disclosure, but for some applications, remote plasma may be equally or even better suited. In some embodiments, the first plasma is direct plasma. In some embodiments, the first plasma is remote plasma.

In some embodiments, the first precursor is provided into the reaction chamber continuously. In some embodiments, the first plasma is provided into the reaction chamber continuously. In some embodiments, the first precursor is provided into the reaction chamber continuously and the first plasma is provided into the reaction chamber continuously. In some embodiments, the first precursor is provided into the reaction chamber in pulses. In some embodiments, the first plasma is provided into the reaction chamber in pulses. In some embodiments, the first precursor is provided into the reaction chamber continuously and the first plasma is provided into the reaction chamber in pulses. In some embodiments, one of the first precursor and the first plasma is provided into the reaction chamber in pulses, and the other continuously. In some embodiments, the first precursor is provided into the reaction chamber in pulses and the first plasma is provided into the reaction chamber continuously. In some embodiments, the first precursor is provided into the reaction chamber continuously and the first plasma is provided into the reaction chamber in pulses.

In some embodiments, the first plasma is generated from an inert gas. In some embodiments, the inert gas comprises a noble gas. In some embodiments, the inert gas is selected from a group consisting of $N_2$, He, Ne and Ar. In some embodiments, the first plasma is generated from Ar. In some embodiments, the first plasma is generated from He. Without limiting the current disclosure to any specific theory, Ar may have suitable properties for partial decomposition of precursor molecules. It may therefore allow the preferred breakage of double bonds comprised in the first precursor for polymerizing the first precursor into gap filling material. In some embodiments, the first plasma is generated by RF plasma generator. In some embodiments, the first plasma is RF-generated plasma.

Providing the first precursor into the reaction chamber, and providing the first plasma into the reaction chamber result in the deposition of gap filling material onto the substrate. In some embodiments, the gap filling material is a fluid at the time of filling the gap. Gap filling material may be at least initially fluid, such as liquid, but may solidify during further plasma exposure or other treatment. In some embodiments, the gap filling material is a liquid at the time of filling the gap. The gap filling material may be at least partially formed already in the gas phase, and due to continued polymerization, it may become liquid and be deposited on the substrate. In liquid state, it may flow into the gap to at least partially fill it.

In some embodiments, a second plasma is provided into the reaction chamber after providing the first plasma into the reaction chamber to amend the properties of the gap filling material. As described above for the first plasma, also the second plasma may be either direct plasma or remote plasma. Thus, a second plasma treatment is performed for the gap filling material. In some embodiments, the second plasma is generated from a non-inert gas. For example, the second plasma may comprise hydrogen. For example, the second plasma treatment may increase crosslinking in the gap filling material, and/or densify the gap filling material. Some material may also be removed from the gap filling material during the second plasma treatment. In some embodiments, the second plasma is generated from a gas comprising hydrogen. In some embodiments, the second plasma is generated from a gas comprising argon, hydrogen and helium. In some embodiments, the second plasma is generated from a gas comprising hydrogen and helium. In some embodiments, the second plasma is generated from a gas consisting essentially of argon, hydrogen and helium. In some embodiments, the second plasma is generated from a gas consisting essentially of hydrogen and helium. In some embodiments, the second plasma may comprise a noble gas. In some embodiments, the second plasma consists essentially of a noble gas. In some embodiments, the second plasma consists essentially of helium.

The second plasma may be provided into the reaction chamber after a predetermined amount of gap filling material has been deposited on the substrate. For example, at least about 0.5 nm of gap filling material may be deposited before providing the second plasma into the reaction chamber. In some embodiments, from about 0.5 nm to about 5 nm, such as from about 1 nm to about 3 nm of gap filling material may be deposited before providing the second plasma into the reaction chamber. In a cyclic process, the second plasma may be provided into the reaction chamber after a predetermined number of deposition cycles. A deposition cycle may be defined as a repeated unit of providing a first precursor into the reaction chamber and/or providing first plasma into the reaction chamber. The second plasma may be provided into the reaction chamber after every deposition cycle, i.e. after each time the first precursor is provided into the reaction chamber and the first plasma is provided into the reaction chamber. Alternatively, the second plasma may be provided into the reaction chamber after every two, three or four deposition cycles, or after about five, about ten or after about 20 deposition cycles. However, in some embodiments, the deposition process is completed before providing the second plasma into the reaction chamber. Thus, the second plasma may be used as a post-deposition treatment. A post-deposition treatment, or an intermittent treatment with the second plasma may be performed in the same reaction chamber or in a different reaction chamber as the deposition process.

The properties of the gap filling material may be amended by other means instead or in addition to a treatment with second plasma. For example, treatment with UV radiation may be used. In some embodiments, the UV treatment is performed in the same reaction chamber as the deposition. In some embodiments, the UV treatment is performed in a different reaction chamber than the deposition.

In some embodiments, a second precursor is provided into the reaction chamber in a vapor phase. The second precursor according to the current disclosure has a similar structure as the first precursor. In other words, the second precursor comprises silicon and carbon, at least one unsaturated carbon-carbon bond and at least one atom selected from oxygen and nitrogen. However, the second precursor has a different structure and/or elemental composition from the first precursor. The second precursor may be used to adjust the properties of the gap filling material. Adjusting the properties of the gap filling material may comprise adjusting the elemental composition of the gap filling material. Therefore, in one aspect, a method of adjusting the properties of a gap filling material is disclosed. The method comprises providing a substrate comprising a gap in a reaction chamber, providing a first precursor comprising silicon and carbon into the reaction chamber in a vapor phase, wherein the first precursor comprises at least one unsaturated carbon-carbon bond and at least one atom selected from oxygen and nitrogen. The method further comprises providing a second precursor comprising silicon and carbon into the reaction chamber in a vapor phase, wherein the second precursor comprises at least one unsaturated carbon-carbon bond and at least one atom selected from oxygen and nitrogen, and has a different structure than the first precursor. The method further comprises providing a first plasma into the reaction chamber to polymerize the first precursor and the second precursor for forming a gap filling material, thereby at least partially filling the gap with the gap filling material.

Optionally, a second plasma may be provided into the reaction chamber to amend the properties of the gap filling material. In some embodiments, the first precursor and the second precursor may be provided into the reaction chamber at least partially simultaneously. In some embodiments, the first precursor and the second precursor may be provided into the reaction chamber at least partially separately. In some embodiments, the reaction is purged between providing the first precursor and the second precursor into the reaction chamber. The first plasma may be provided into the reaction chamber between providing the first and the second precursor into the reaction chamber.

The first precursor and the second precursor may be selected from the compounds disclosed herein. However, the second precursor may be another silicon-comprising precursor known in the art. In some embodiments, the first precursor comprises oxygen, and the second precursor comprises nitrogen. In some embodiments, the first precursor comprises nitrogen, and the second precursor comprises oxygen. In some embodiments, the first precursor and the second precursor comprise oxygen. In some embodiments, the first precursor and the second precursor comprise nitrogen.

As used herein, the term purge may refer to a procedure in which vapor phase precursors, reactants and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant Purging may avoid, or at least reduce, gas-phase interactions between the two gases. It shall be understood that a purge can be effected either in time or in space, or both. For example in the case of temporal purges, purging can be used e.g. in the temporal sequence of providing a first precursor to a reactor chamber, providing a purge gas to the reactor chamber, and providing a second precursor to the reactor chamber, wherein the substrate on which a material is deposited does not move. For example in the case of spatial purges, purging can take the following form: moving a substrate from a first location to which a first precursor is supplied, through a purge gas curtain, to a second location to which a second precursor is supplied. Supplying of each precursor may be continuous or non-continuous. Purging times may be, for example, from about 0.01 seconds to about 20 seconds, from about 0.05 s to about 20 s, or from about 0.1 s to about 20 s, or from about 0.5 s to about 20 s, or from about 0.01 s to about 10 s, or from about 5 s to about 20 s, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor.

In some embodiments, the method comprises removing excess first precursor from the reaction chamber by an inert gas prior to providing the second precursor into the reaction chamber. In some embodiments, the reaction chamber is purged between providing a first precursor into a reaction chamber and providing plasma into the reaction chamber. In some embodiments, there is a purge step after every precursor pulse.

In some embodiments, the carbon content of the gap filling material is at least about 30 at-%. In some embodiments, the carbon content of the gap filling material is from about 30 at-% to about 70 at-%, such as about 40 at-%, or about 50 at-% or about 60 at-%. Without limiting the current disclosure to any specific theory, the carbon content of the gap filling material may be increased due to more selective polymerization preferentially through the unsaturated carbon-carbon bonds of the first precursor, and the second precursor if applicable.

In some embodiments, the gap filling material has a wet etch rate ratio (WERR) of below 0.6. By the wet etch rate ratio is herein meant the ratio of the wet etch rate of the gap filling material deposited by the methods according to the current disclosure relative to a wet etch rate of thermal silicon oxide in dilute hydrofluoric acid (1:100). WERR may be less than about 0.6, or less than about 0.5, or less than about 0.3, or less than about 0.20, or less than about 0.1, or less than about 0.05, such as about 0.04.

The temperature of the reaction chamber and/or the substrate influences the deposition process according to the current disclosure. Low temperatures may be advantageous for the controlled decomposition of the first and second precursor by plasma. The methods disclosed herein may be performed at a temperature of below 150° C. or below 100° C. In some embodiments, gap filling material may be deposited at a temperature from about 65° C. to about 150° C., such as at a temperature of about 70° C., 75° C., 80° C., 90° C. or 100° C.

The pressure in a reaction chamber during the deposition process may be below 20 Torr. The pressure in a reaction chamber during the deposition process may be above 5 Torr. For example, the pressure in a reaction chamber during the deposition process may be about 7 Torr, about 9 Torr or about 10 Torr.

A low first plasma power may be used in the method according to the current disclosure. For example, the first plasma power may be from about 20 W to about 120 W, such as about 50 W.

In one aspect a semiconductor structure comprising a gap filled by a method according to the current disclosure is disclosed. In another aspect a semiconductor device comprising a gap filled by a method according to the current disclosure is disclosed. A semiconductor device, such as a transistor, may comprise a structure according to the current disclosure.

DETAILED DESCRIPTION OF DRAWINGS

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1 illustrates a method 100 in accordance with exemplary embodiments of the current disclosure as a block diagram. In the first phase 102, a substrate comprising a gap is provided in a reaction chamber. A substrate according to the current disclosure may comprise, for example, an oxide, such as silicon oxide, for example thermal silicon oxide or native silicon oxide). A substrate may comprise a nitride, such as silicon nitride or titanium nitride, a metal, such as copper, cobalt or tungsten, chalcogenide material, such as molybdenum sulfide. The deposited gap filling material may be used in the manufacture of electronic devices.

The reaction chamber can form part of a chemical vapor deposition (CVD) assembly. The assembly may be a single wafer reactor. Alternatively, the reactor may be a batch reactor. The assembly may comprise one or more multi-station deposition chambers. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool.

A first precursor is provided into the reaction chamber containing the substrate at phase 104. Without limiting the current disclosure to any specific theory, the first precursor may at least partially chemisorb on the substrate during providing the first precursor into the reaction chamber. Providing the first precursor into the reaction chamber may be continuous or performed in pulses. The duration of a first precursor pulse (first precursor pulse time) may be, for example, from about 0.1 to about 15 seconds, from about 0.5 to about 10 seconds, from about 0.5 to about 5 seconds, or from about 0.1 seconds to about 1.5 seconds, or from about 0.1 seconds to about 1 second, or from about 0.1 seconds to about 0.8 seconds, or from about 0.1 seconds to about 0.5 seconds. In some embodiments, the first precursor pulse length is below 1 second, such as 0.2 seconds, 0.3 seconds or 0.7 seconds.

When first plasma is provided into the reaction chamber at phase 106, it may react with the first precursor, or its derivate species, in the gas phase or on the substrate to form a polymer of the first precursor. Providing the first plasma into the reaction chamber may be continuous or performed in pulses. The duration of a first plasma pulse (first plasma pulse time) may be, for example from about 0.1 to about 15 seconds, from about 0.5 to about 10 seconds, from about 0.5 to about 5 seconds, or from about 0.5 to about 3 seconds. In some embodiments, the first plasma pulse time may be shorter than 25 s, shorter than 15 s, shorter than 8 s, shorter than 5 s, or shorter than 2 s.

If the first precursor and the first plasma are provided into the reaction chamber continuously, providing them is continued until a desired amount of material is deposited. The desired amount depends on the application in question and on the size of the gap being filled. For example, the deposition may be continued from about 0.5 seconds to several hours, such as from about 0.5 seconds to about 60 minutes, or from about 0.5 seconds to about 30 minutes, or from about 0.5 seconds to about 10 minutes, or from about 0.5 seconds to about 1 minute. In some embodiments, the deposition is continued from about 5 seconds to about 2 hours, or from about 5 seconds to about 30 minutes, or from about 10 seconds to about 60 minutes, or from about 10 seconds to about 15 minutes, or from about 20 seconds to about 60 minutes.

In some embodiments, the first precursor is heated before providing it into the reaction chamber. In some embodiments, the first precursor is kept in ambient temperature before providing it to the reaction chamber.

Phases 104 and 106, performed in any order if pulsing regime is used for at least one of the first precursor and the first plasma, may form a deposition cycle. In some embodiments, the two phases deposition, namely providing the first precursor into the reaction chamber and providing plasma into the reaction chamber (104 and 106), may optionally be repeated (dashed loop 108). In such embodiments, the methods contain several deposition cycles. The thickness of the deposited gap filling material may be regulated by adjusting the number of deposition cycles. The deposition cycle (loop 108) may be repeated until a desired gap filling material thickness is achieved. For example, about 50, 100, 200, 300, 400, 500, 700, 800 or 1,000, deposition cycles may be performed. The growth speed of the material deposited according to the methods disclosed herein may be relatively fast. However, the final thickness of the deposited material may be affected by optional treatments with the second plasma, which may lead to shrinking of the deposited material.

Although phases 104 and 106, as well as additional process phases described below, are depicted as separate phases, in many embodiments, the process phases may overlap. Specifically, providing a first precursor into the reaction chamber and providing plasma into the reaction chamber may overlap partially or completely. One of the phases 104 and 106 may also be performed continuously, while the other one may be performed in a pulsed manner. Loop 108 may be absent in embodiments which are not cyclic.

Figure 2:
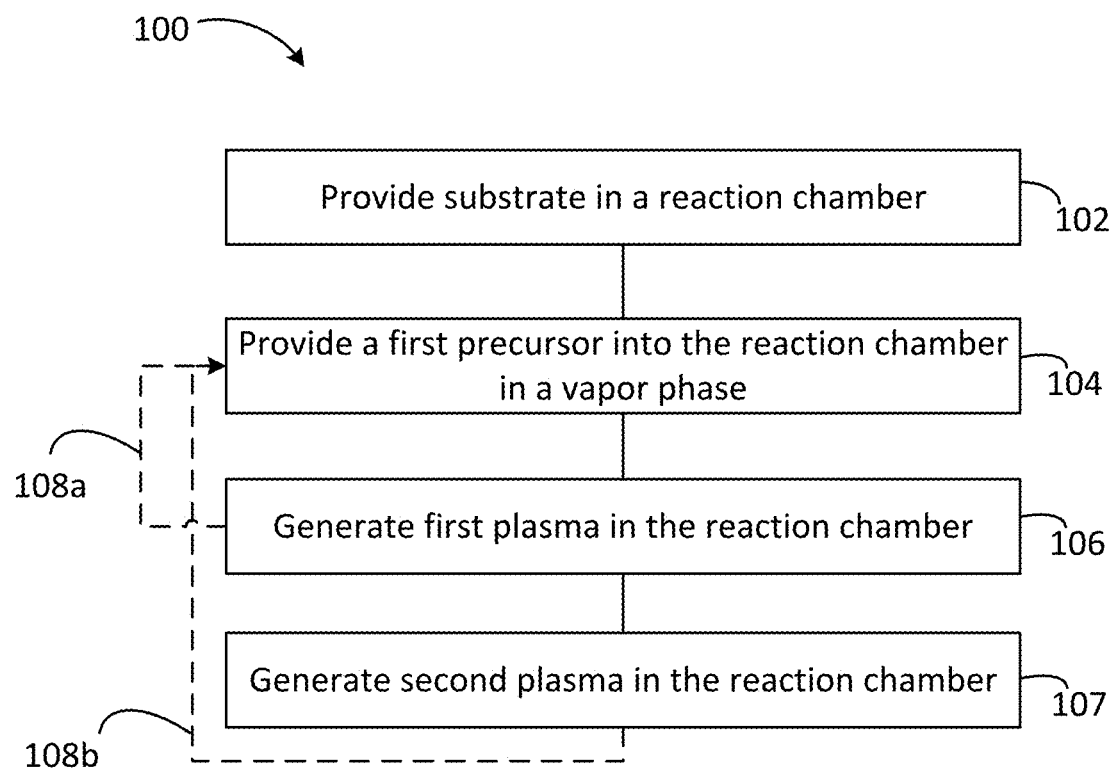
FIG. 2 illustrates a method in accordance with exemplary embodiments of the current disclosure.

FIG. 2 illustrates another embodiment of a method according to the current disclosure as a block diagram. A similar deposition process as described above is depicted, with phases 102, 104 and 106 as detailed above. In FIG. 2, the process comprises providing a second plasma into the reaction chamber 107 after providing the first plasma into the reaction chamber 106. In a non-cyclic embodiment, phases 102, 104, 106 and 107 are performed in the indicated order. However, the loops 108a and 108b indicate cycling possibilities in cyclic embodiments. If loop 108a is performed at least once during the process, the gap filling material is first accumulated as desired, and then a second plasma is provided into the reaction chamber 107. This may happen only once, at the end of the process as in non-cyclic embodiments, or intermittently, if loop 108b is performed. Loop 108b may be performed independently of performing loop 108a.

As described above for FIG. 1, different phases of the process may be performed as separate phases, or they may overlap at least partially.

Figure 3:
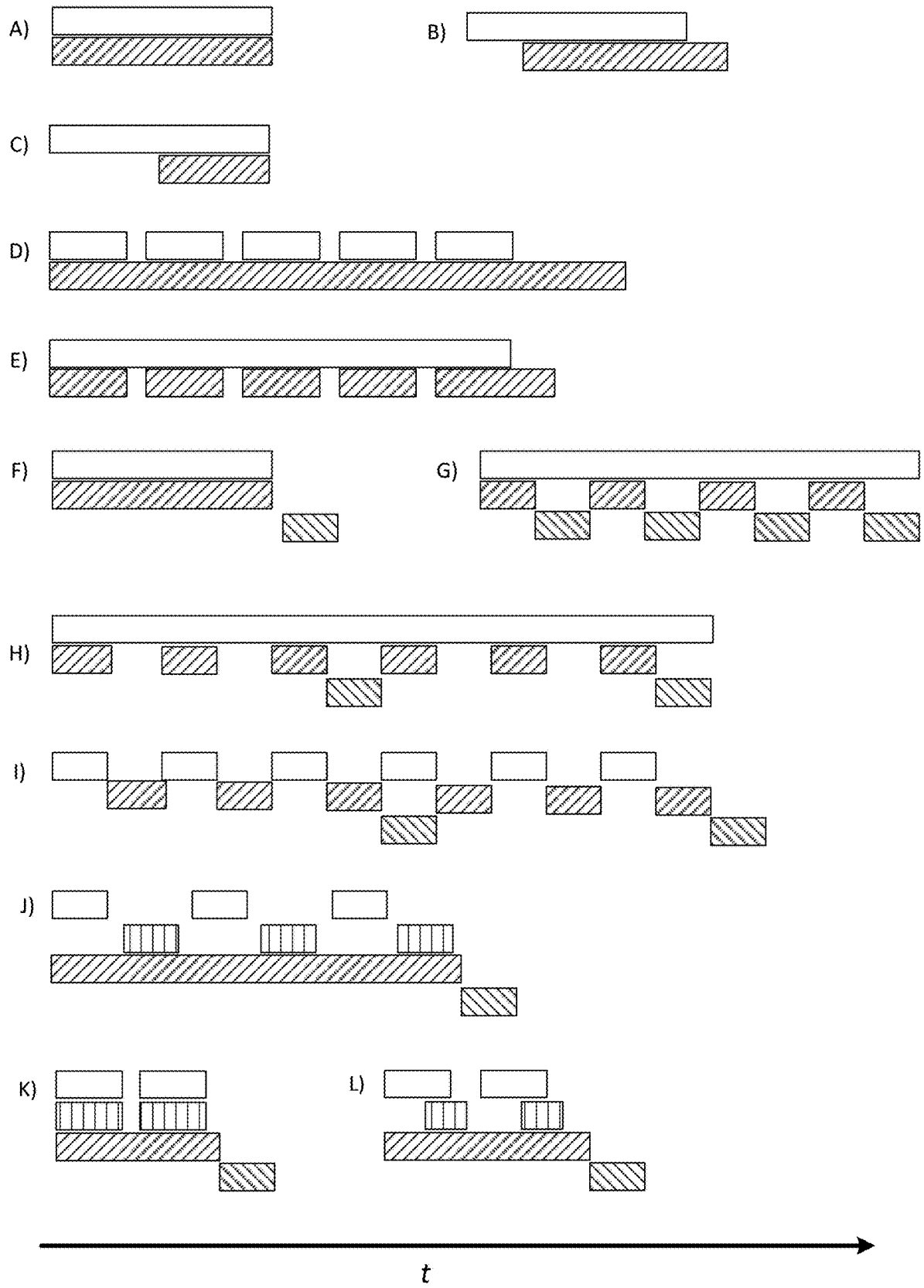
FIG. 3 is a schematic presentation of embodiments according to the current disclosure

FIG. 3 is a schematic presentation of embodiments according to the current disclosure. FIG. 3 illustrates the possibility of overlapping phases, and the inclusion of a second precursor into the deposition process according to the current disclosure. Timeline is indicated at the bottom of FIG. 3 by an arrow, providing first precursor into the reaction chamber is indicated with a white bar, and providing first plasma is depicted with forward hatching. Providing second plasma into the reaction chamber is indicated by backward hatching, as of panel G) of FIG. 3. Providing a second precursor into the reaction chamber is depicted with vertical hatching (as of panel J)). The lengths of the bars depicting process phases, as well as embodiments depicted in different panels are not drawn to scale.

In panel A, a simple process involving constant flow of the first precursor and providing first plasma continuously is indicated. In the illustration, both are initiated and stopped at the same time, but either of the two could be initiated earlier, and, independently, one could be stopped earlier, as indicated in panels B) and C). In the embodiment of panel B) the first precursor is provided into the reaction chamber before the first plasma is provided into the reaction chamber, and the first plasma is provided into the reaction chamber longer than first precursor is provided therein. In the embodiment of panel C), the first precursor is provided into the reaction chamber significantly earlier than the first plasma is provided therein, and both are stopped at the same time.

In panel D) the first precursor is pulsed, and the first plasma is provided into the reaction chamber continuously. In panel E), the pulsing scheme is the opposite, and the first precursor is provided into the reaction chamber continuously, and the first plasma is provided into the reaction chamber in pulses. In both panels D) and E), the first plasma is provided after providing of the first precursor has been stopped.

In panels F) to L), a second plasma is used in the embodiments. In panels F) to I), the process is performed with one precursor, whereas in panels J) to L), a second precursor is also used. Panel F) illustrates embodiments similar to panel A), where a second plasma is provided into the reaction chamber after both providing the first precursor and providing plasma into the reaction chamber have ended. Thus, panel F) depicts a post-treatment of the gap filling material with a second plasma.

Panel G) illustrates embodiments, in which first plasma and second plasma are cycled, and the first precursor is provided into the reaction chamber continuously. In such embodiments, the properties of the deposited gap filling material are continuously amended. This may have advantages in the uniformity of the final deposited material. However, a post-treatment scheme according to panel F), for example, may be faster. Panel H) depicts a variation of a cyclic plasma regime, in which the first plasma is provided into multiple pulses (three in the depicted embodiment, but could vary from two upwards) before a second plasma is provided into the reaction chamber. The flow of the first precursor has been depicted as continuous in panel H) for simplicity, and panel I) illustrates an otherwise identical embodiment, in which both first precursor and first plasma are pulsed.

As the embodiments of panels J) to L) introduce yet another possible component of the method, namely the second precursor, providing plasmas is indicated as continuous in all panels for clarity. It is explicitly contemplated that also in embodiments comprising two precursors, the the first plasma and/or the second plasma may be pulsed, and the deposition process may be cyclic.

In panel J) first and second precursor are alternated, i.e. pulsed. In panel K), providing the two precursors into the reaction chamber overlaps completely, and in panel L) partly. Also, in panel L), the second precursor pulse time is shorter than that of the first precursor. Such variations may be used in adjusting the composition and properties of the gap filling material.

It should be noted that all purge phases have been omitted from the schematic presentations. However, in some embodiments, purge may be used to regulate the process, and/or to remove side products from the reaction chamber.

Figure 4:
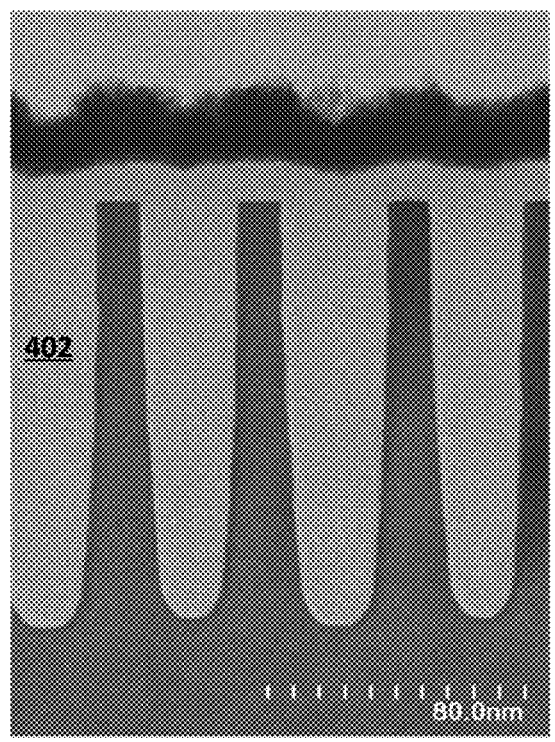
FIG. 4 is a transmission electron micrograph of gaps filled with gap filling material deposited according to at least one embodiment of the methods of the current disclosure.

FIG. 4 is a transmission electron micrographs of gaps filled with gap filling material deposited according to at least one embodiment of the methods of the current disclosure. In an exemplary deposition experiments, the result of which is indicated in FIG. 4, a silicon oxide-based structure 400 was provided in a reaction chamber. The temperature during the deposition was about 65° C., and the pressure in the reaction chamber was about 9.5 Torr. Plasma power of about 50 W was used for the first plasma, and the plasma was provided into a gas comprising substantially only Ar. The first precursor was vinylmethyldimethoxysilane. Uniform void-free gapfill 402 of the gaps in the structures was achieved. Using the method, growth speeds of between 30 nm/min and 50 nm/min were achieved on blanket wafers.

The composition of the deposited gap filling material was analyzed. In tests without second plasma treatment, the deposited gap filling material comprised 26 At-% Si, 25 At-% O and 48 At-% C. In tests second plasma treatment, the deposited gap filling material comprised 29 At-% Si, 35 At-% O and 37 At-% C. The measured Young's modulus (GPa) for the above materials was 0.9 and 52, respectively, and the hardness (GPa) 0.06 and 7.5, respectively.

The particular implementations shown and described are illustrative of the invention are not intended to otherwise limit the scope of the aspects and implementations in any way. Indeed, for the sake of brevity, conventional manufacturing, connection, preparation, and other functional aspects of the system may not be described in detail.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A method of filling a gap, the method comprising:
providing a substrate comprising a gap in a reaction chamber;
providing a first precursor comprising silicon and carbon into the reaction chamber in a vapor phase, wherein the first precursor comprises at least one unsaturated carbon-carbon bond and at least one nitrogen atom, and wherein the first precursor does not comprise oxygen; and
providing a first plasma into the reaction chamber to polymerize the first precursor for forming a gap filling material;
thereby at least partially filling the gap with the gap filling material.

2. The method of claim 1, wherein the first plasma is generated from an inert gas.

3. The method of claim 2, wherein the inert gas is selected from the group consisting of N2, He, Ne and Ar.

4. The method of claim 1, wherein the at least one unsaturated carbon-carbon bond is a double bond.

5. The method of claim 1, wherein the first precursor comprises an alkyl silane.

6. The method of claim 5, wherein the alkyl silane comprises at least two different alkyl groups.

7. The method of claim 1, wherein the first precursor comprises an alkoxy silane.

8. The method of claim 1, wherein the first precursor comprises a vinyl group.

9. The method of claim 1, wherein the first precursor does not comprise nitrogen.

10. The method of claim 1, wherein the first precursor does not comprise a halogen.

11. The method of claim 1, wherein the gap filling material is a fluid at the time of filling the gap.

12. The method of claim 1, wherein the first plasma is provided into the reaction chamber in pulses.

13. The method of claim 1, wherein the carbon content of the gap filling material is at least 30 at-%.

14. The method of claim 1, wherein a second precursor is provided into the reaction chamber in a vapor phase.

15. The method of claim 1, wherein a second plasma is provided into the reaction chamber after providing the first plasma into the reaction chamber to amend the properties of the gap filling material.

16. The method of claim 15, wherein the second plasma is generated from a gas comprising hydrogen.

17. The method of claim 1, wherein the gap filling material has a wet etch rate ratio of below 0.6.

18. A method of filling a gap, the method comprising:
providing a substrate comprising a gap in a reaction chamber;
providing a first precursor into the reaction chamber in a vapor phase; and
providing a first plasma into the reaction chamber to form a fluid gap filling material; and
thereby at least partially filling the gap with the gap filling material,
wherein the first precursor comprises a molecule according to formula (I or II),

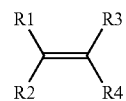

(I)

-continued
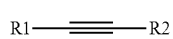
(II)
wherein each of R1, R2, R3 and R4 is independently selected from H and C1 to C6 saturated and unsaturated alkyl groups, with the proviso that at least one of R1, R2, R3 and R4 comprises independently a silicon atom and a nitrogen atom.
* * * * *